US009397670B2

(12) United States Patent
van der Wagt et al.

(10) Patent No.: US 9,397,670 B2
(45) Date of Patent: Jul. 19, 2016

(54) EDGE GENERATOR-BASED PHASE LOCKED LOOP REFERENCE CLOCK GENERATOR FOR AUTOMATED TEST SYSTEM

(71) Applicant: Teradyne, Inc., North Reading, MA (US)

(72) Inventors: Jan Paul Anthonie van der Wagt, Carlsbad, CA (US); Jeffrey Wade Sanders, Thousand Oaks, CA (US); Thomas Aquinas Repucci, Blaine, MN (US); Ronald A. Sartschev, Andover, MA (US)

(73) Assignee: Teradyne, Inc., North Reading, MA (US)

( * ) Notice: Subject to any disclaimer, the term of this patent is extended or adjusted under 35 U.S.C. 154(b) by 64 days.

(21) Appl. No.: 14/322,375

(22) Filed: Jul. 2, 2014

(65) Prior Publication Data

US 2016/0006441 A1      Jan. 7, 2016

(51) Int. Cl.
*H03K 5/13* (2014.01)
*H03L 7/08* (2006.01)
*H03L 7/099* (2006.01)
*H03K 5/14* (2014.01)

(52) U.S. Cl.
CPC ............... *H03L 7/0802* (2013.01); *H03K 5/14* (2013.01); *H03L 7/099* (2013.01)

(58) Field of Classification Search
CPC ......... H03K 5/13; H03K 5/131; H03K 5/133; H03K 5/14; H03L 7/0802; H03L 7/099; H03L 7/0991; H03L 7/0994
USPC ......... 327/105–107, 113, 114, 147, 149, 150, 327/156, 158, 159, 291, 299
See application file for complete search history.

(56) References Cited

U.S. PATENT DOCUMENTS 4,777,452 A * 10/1988 Hayami ............ G11B 20/1403
329/311
5,155,451 A * 10/1992 Gladden ................. H03L 7/183
327/105

(Continued)

FOREIGN PATENT DOCUMENTS

JP      2010-252126 A      11/2010

OTHER PUBLICATIONS

PCT International Search Report and Written Opinion o fthe International Searching Authority from International Application No. PCT/US2015/036914, dated Sep. 30, 2015.

*Primary Examiner* — William Hernandez
(74) *Attorney, Agent, or Firm* — Wolf, Greenfield & Sacks, P.C.

(57) ABSTRACT

An automatic test system configured for generating a periodic signal of a programmable frequency. The automatic test system may comprise a clock, an edge generator coupled to the clock, a phase locked loop, and a delay adjustment circuit. The edge generator may comprise an edge generator output, an enable input and a delay input. The edge generator may produce at the edge generator output a signal with a delay relative to an edge of the clock specified by a value at the delay input in each cycle of the clock for which the enable input is asserted. The phase locked loop may comprise a reference input and a phase locked loop output configured to provide the periodic signal of the programmable frequency. The delay adjustment circuit may comprise an accumulator that may increase in value by a programmed amount for each cycle of the clock.

20 Claims, 8 Drawing Sheets

(56) References Cited

U.S. PATENT DOCUMENTS

| | | | | |
|---|---|---|---|---|
| 5,646,968 A * | 7/1997 | Kovacs | ............ | H03K 3/0231 327/158 |
| 6,055,644 A * | 4/2000 | Henkel | ............ | G06F 1/06 713/500 |
| 6,154,071 A * | 11/2000 | Nogawa | ............ | H03L 7/14 327/147 |
| 6,396,313 B1 | 5/2002 | Sheen | | |
| 6,531,903 B1 | 3/2003 | Wichman | | |
| 6,976,183 B2 | 12/2005 | Gage et al. | | |
| 7,064,616 B2 | 6/2006 | Reichert | | |
| 7,319,936 B2 | 1/2008 | Reichert | | |
| 7,336,748 B2 | 2/2008 | Aubert et al. | | |
| 7,356,111 B1 * | 4/2008 | Dean | ............ | H03L 7/0996 327/156 |
| 7,379,395 B2 | 5/2008 | Gage et al. | | |
| 7,454,681 B2 | 11/2008 | Reichert et al. | | |
| 7,769,559 B2 | 8/2010 | Reichert | | |
| 2004/0247066 A1 | 12/2004 | Suda | | |
| 2006/0034408 A1 | 2/2006 | Lin | | |
| 2006/0095221 A1 * | 5/2006 | Salmi | ............ | G01R 31/31922 702/106 |
| 2006/0176525 A1 * | 8/2006 | Mizuta | ............ | H04N 1/0473 358/474 |
| 2013/0135011 A1 | 5/2013 | Chen et al. | | |

\* cited by examiner

EDGE GENERATOR-BASED PHASE LOCKED LOOP REFERENCE CLOCK GENERATOR FOR AUTOMATED TEST SYSTEM

DISCUSSION OF RELATED ART

Semiconductor devices are tested, often multiple times, during their manufacture. A piece of automatic test equipment, referred to as a "tester," is used to generate test signals that stimulate a device under test (DUT) and to measure the response. The tester determines whether a DUT is operating properly by comparing the response evoked by a carefully controlled test pattern with an expected response. To test DUTs completely, the tester should generate and measure signals such as may be found in the operating environment of those DUTs.

Automatic test equipment must now generate both digital and analog signals. Accordingly, test equipment is typically made to contain multiple instruments. Each instrument performs a specific function, such as generating high speed digital signals or producing an analog waveform that has a programmed characteristic. Multiple instruments are installed in a tester to provide the combination of analog and digital signals needed to test a particular device. Creating instruments that provide separate test functions provides a flexible way to create a test system that can generate and measure a set of test signals required for testing virtually any semiconductor device.

There is often a practical limit to the frequency of a reference clock that can be reliably fanned out to many instruments in a test system, which can be undesirable. Each instrument may generate its own reference clock from a lower frequency clock.

One known reference clock generator uses Direct Digital Synthesis (DDS), which is a technique used to generate periodic signals. The DDS clock generator may generate a periodic signal of a programmable, but low frequency. That periodic signal may be input into a phase locked loop (PLL), which serves as a frequency multiplier to generate a higher frequency reference clock.

A DDS-based reference clock generator may store in a memory samples representing a cycle of a periodic signal. During each cycle of the lower frequency clock, the DDS-based reference clock generator may increment a counter (or phase accumulator) that provides an address to memory. The larger the increment, the faster the DDS-based reference clock generator may step through the values of the cycle stored in the memory, and the higher the output frequency that may be fed into the PLL.

A DDS-based reference clock generator may include a fixed frequency reference clock, a frequency control register, a numerically controlled oscillator, a digital-to-analog converter (DAC), a low-pass filter, and a clip amp (clipper).

SUMMARY

Some aspects include a periodic signal generation circuit for generating a periodic signal of a programmable frequency. The periodic signal generation circuit may comprise a phase locked loop, a programmable delay pulse generator circuit, and an adjustment circuit. The phase locked loop may comprise a controllable oscillator and a comparator. The controllable oscillator may comprise a controllable oscillator output and a control input. The controllable oscillator may be configured to produce the periodic signal at the controllable oscillator output with a frequency controlled by a control signal at the control input. The comparator may comprise a first input and a second input and a comparator output. The comparator may be configured to produce a signal at the comparator output, which may be representative of a difference in a phase characteristic between a first signal at the first input and a second signal at the second input. The comparator output may be coupled to the control input of the controllable oscillator. The controllable oscillator output may be coupled to the second comparator input. The programmable delay pulse generator circuit may comprise a delay control input and an output. The output of the programmable delay pulse generator circuit may be coupled to the first input of the comparator. The programmable delay pulse generator circuit may be configured to output a pulse at the output of the programmable delay pulse generator circuit with a programmable delay following a transition of a reference signal. The adjustment circuit may compute a value of the programmable delay for each of a plurality of cycles of the first signal.

Further aspects include a method of generating a periodic signal of a programmed frequency. The method may comprise generating an output signal, producing a feedback signal by dividing in frequency the output signal, producing a reference signal, and comparing the feedback signal to the reference signal to generate a frequency control signal. The output signal may comprise a controlled frequency that may be controlled in response to the frequency control signal. Producing the reference signal may comprise controlling a timing of each of a plurality of pulses in the reference signal such that the controlled frequency of the output signal may correspond to the programmed frequency.

Additional aspects include an automatic test system configured for generating a periodic signal of a programmable frequency. The automatic test system may comprise a clock having a period, an edge generator coupled to the clock, a phase locked loop, and a delay adjustment circuit. The edge generator may comprise an edge generator output, an enable input, and a delay input. The edge generator may produce at the edge generator output a signal with a delay relative to an edge of the clock specified by a value at the delay input in each cycle of the clock for which the enable input is asserted. The phase locked loop may comprise a reference input and a phase locked loop output configured to provide the periodic signal of the programmable frequency. The reference input may be coupled to the edge generator output. The delay adjustment circuit may comprise a delay adjustment circuit output coupled to the delay input of the edge generator, and an accumulator that increases in value by a programmed amount for each cycle of the clock. When the accumulated value exceeds the period of the clock, the delay adjustment circuit may suppress an enable signal coupled to the enable input of the edge generator and may roll over the accumulated value.

The foregoing is a non-limiting summary of the invention as defined by the appended claims.

BRIEF DESCRIPTION OF THE FIGURES

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

The inventors have recognized and appreciated that the size and power consumption of an automatic test system may be reduced using a reference clock generator based on a programmable delay pulse generator. The programmable delay pulse generator may be implemented using one or more timing generator circuits that might otherwise be present in the test system, further reducing the size and power consumption of such a reference clock generator.

In particular, reference clock generators using DDS can be very large and consume high power. The large size may result from the numerous components required, such as a digital-to-analog converter (DAC), a low-pass filter, and a clipper. The size and power consumption of a reference clock generator may have an even more significant impact in a test system that has multiple timing generator channels, in which reference clocks of different frequencies may be desired.

The inventors have recognized and appreciated that using a programmable delay pulse generator, which may be using an edge generator, to provide a low frequency periodic signal may require fewer and smaller components, resulting in smaller circuitry (possibly by a factor of ten or more), and less power consumption. The inventors have recognized and appreciated that this approach may achieve these improvements without decreasing accuracy. Therefore, tester hardware using a programmable delay pulse generator may be smaller, lower cost, consume less power, and/or dissipate less heat than conventional tester designs offering the same accuracy.

Figure 1:
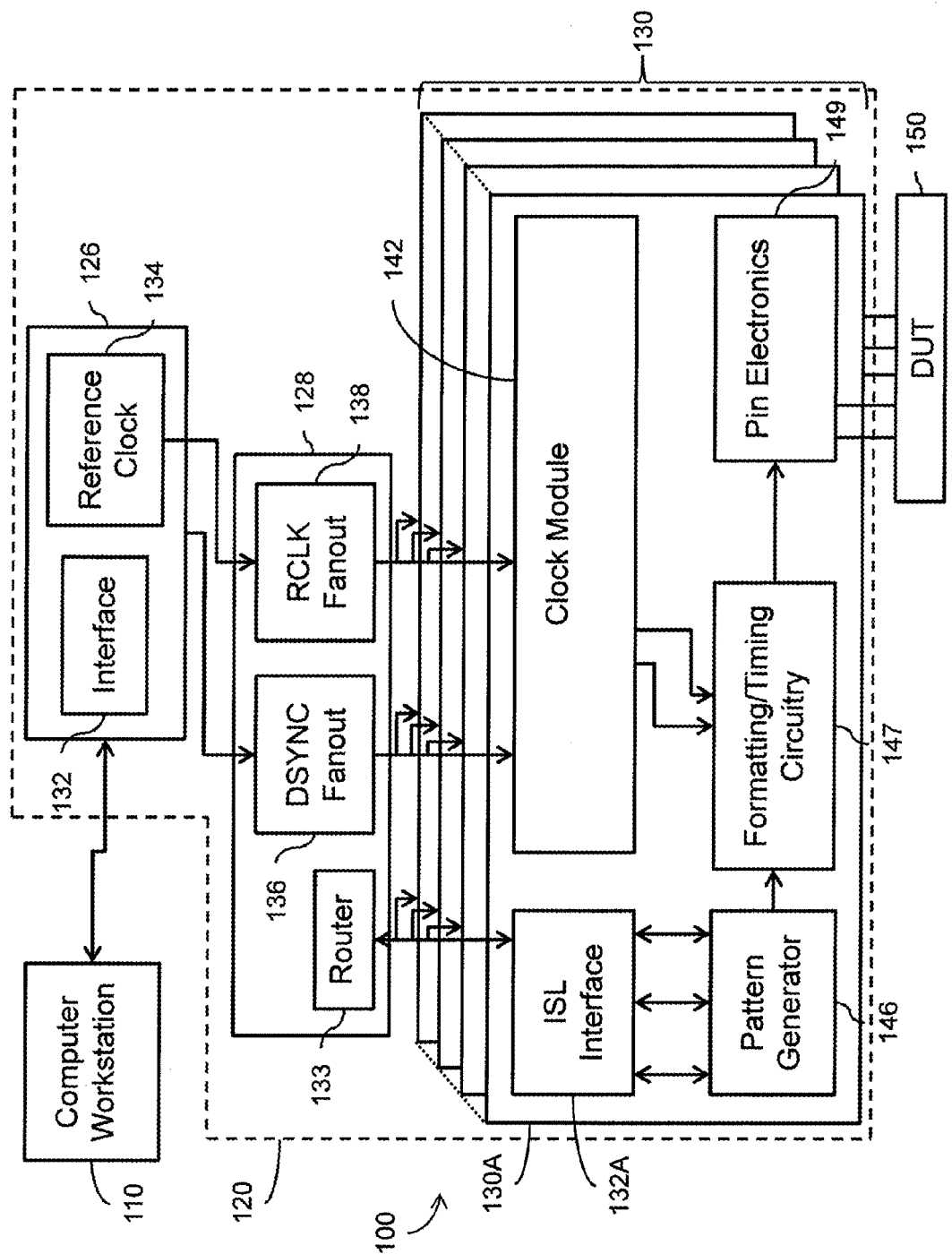
FIG. 1 is a block diagram of an automatic test system.

FIG. 1 illustrates an exemplary test system in which a reference clock generator as described herein may be implemented. This test system may use, as a programmable delay pulse generator in a reference clock generator, a timing generator that might otherwise be present in the test system to generate digital signals. For many types of tests, operations of a tester may be controlled by edges in each of a number of channels, each of which is connected to a test point, sometimes called a "pin," on the DUT. The edges may be generated by a timing generator associated with the channel, and may be sent to pin electronics. The same timing generators associated with pins may be used in a reference clock generator. Alternatively or additionally, additional copies of similar circuitry may be added to provide a reference signal to a reference clock generator. However, it should be appreciated that any suitable programmable delay pulse generator may be used to provide an input to a PLL or other frequency multiplication circuit in a reference clock generator.

In a conventional test system, an edge generator may be programmable to output a pulse at a programmed time, relative to a low frequency reference clock that indicates periods of test system operation. This programmability enables a tester to test many different types of semiconductor devices. The test system may be programmable in other ways, too. For example, a test pattern may specify various parameters, such as the signal to apply to each test point on the DUT, the signal expected to be read from the DUT, and the time of the edges that control the generation or measurement of test signals. When testing a DUT, precision may be needed in producing the stimulus signals and controlling the measurement times.

This precision may be achieved through precise timing of edges. A tester cycle may last for multiple cycles of a test system clock. Accordingly, timing of edges within a tester cycle may be determined by counting pulses of the test system clock. However, the test system clock may not provide a desired timing resolution. Higher resolution may be achieved with an edge generator that controls timing of edges through the use of a programmable delay.

FIG. 1 illustrates an embodiment of an automatic test system or tester, generally designated 100, that may include a computer workstation 110 and a test head 120 (in phantom). The test head may house a plurality of electronic board assemblies for generating and measuring test signals, including central card 126, distribution card 128, and multiple instrument cards 130.

As illustrated in FIG. 1, the central card 126 may feed signals to distribution card 128 for distribution to an array of instrument cards 130. The central card 126 may include a computer interface 132 that ties the workstation 110 to the testhead board assemblies, and a reference clock generator 134 that generates a low frequency reference clock, denoted RCLK. The reference clock generator may comprise, for example, a 100 or 400 MHz crystal oscillator. Computer interface 132 may allow the tester to be interfaced to a computer work station 110, through which a user may develop test programs that can be loaded into tester 120. Computer work station 110 may provide a user with other capabilities, such as initiating execution of previously developed test programs or analyzing test results.

The central card 126 may include control circuitry that generates control signals responsive to commands from the workstation. One of the control signals may comprise a "DSYNC" signal. The DSYNC signal may provide a reference time to all instruments or other components intended to have synchronized operation. The reference clock signal and the DSYNC signal may be fanned-out, or distributed, along DSYNC and RCLK fan-out circuitry 136 and 138, respectively, disposed on the distribution of card 128. Distribution of these signals may allow pattern generators on multiple instruments to be started and operate in unison.

The instruments on instrument cards 130 may be digital or analog instruments or may perform functions involving digital and analog signals. Instrument 130A depicts a digital instrument, also called a "channel card." A channel card may contain electronic resources for multiple tester channels. A test system is likely to include multiple channel cards.

As shown in FIG. 1, each instrument card includes circuitry to perform the desired function of the instrument. In the case of a digital instrument such as 130A, the functional circuitry may include formatting/timing circuitry 147 and pin electronics circuitry 149. This circuitry can generate and measure digital signals for testing DUT 150.

In addition, digital instrument 130A may include a pattern generator 146. Pattern generator 146 may provide a sequence of commands that control the functional portions of instrument 130A. Pattern generator 146 may provide branching in response to certain conditions or execute other conditional functions based on a status of the test system. Pattern generator 146 may be clocked by a clock from local clock module 142 and may therefore provide instructions at a programmable rate, which may be higher than the frequency of the reference clock.

In addition, instrument 130A may include an instrument synchronization link (ISL) interface 132A. ISL interface 132A may allow pattern generator 146 to communicate with other instruments, which may similarly contain an ISL interface. Pattern generator 146 may send commands to be executed by the functional circuitry of other instruments or receive status information from other instruments that may, for example, be used to control conditional branching.

Other instruments may have different functional circuitry, depending on the specific function to be implemented by the instrument. In the described embodiment, each instrument card may include a clock module 142. However, as noted above, each instrument may have none, one, or more clock modules.

As shown in FIG. 1, each channel card 130A includes a clock module 142. Clock module 142 may be programmed to generate one or more clocks of a desired frequency from RCLK. In the described embodiment, each of the clocks generated by a clock module 142 is intended to be used "locally," i.e., within the instrument or board containing the clock generator. A clock generator may generate clocks of several different frequencies. Because all of the clocks are generated from the same source, the clocks may be considered synchronous with each other. However, it should be appreciated that the number of clocks generated in a clock module, and whether those clocks are used locally or distributed to other instruments, is not critical to the invention.

The clock module may contain circuitry that generates a reference clock at a low, but programmable frequency. That low frequency reference clock may be supplied to a PLL or other circuit to generate the reference clock. A PLL may be configured to multiply the frequency of the low frequency reference clock. Alternatively or additionally, the PLL may include a filter that controls jitter. Examples of suitable circuitry that may be included in a clock module 142 are described below.

In accordance with some embodiments, the low frequency reference clock may be generated by a programmable delay pulse generator. A control circuit may provide a delay value to the programmable delay pulse generator to provide pulses at a desired frequency. That frequency may be selected so that, when multiplied in the PLL, the resulting frequency is the desired frequency of the reference clock.

Figure 2:
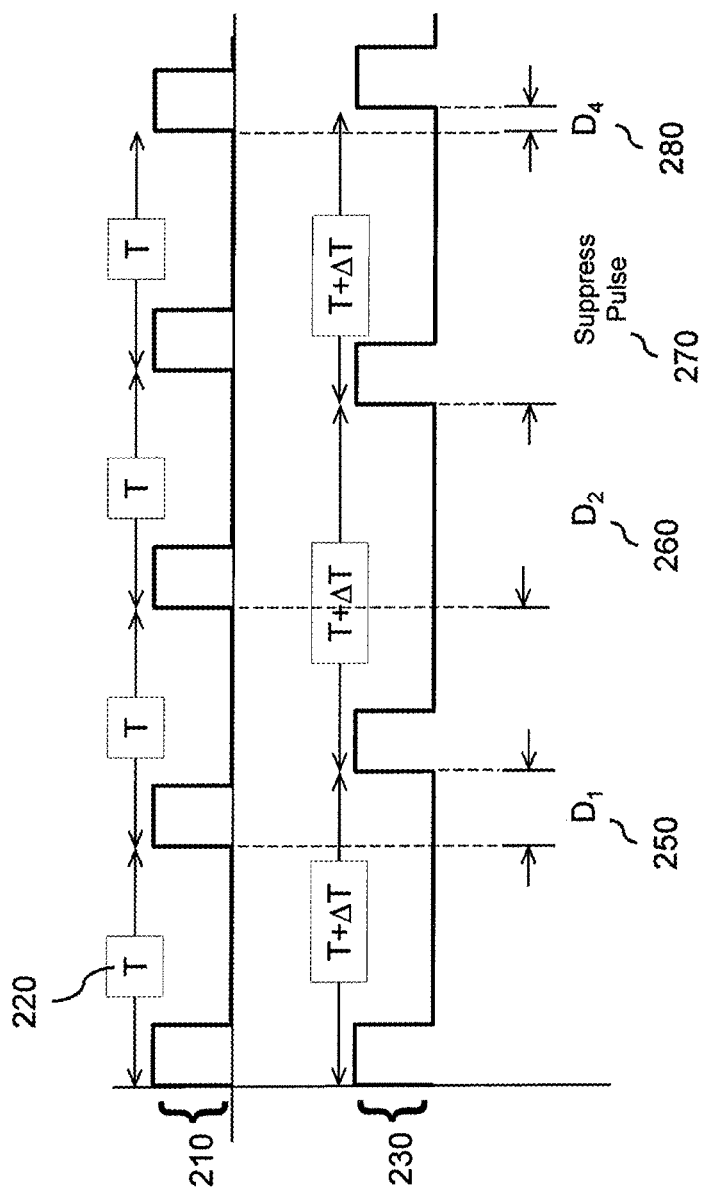
FIG. 2 is a timing diagram illustrating operation of a programmable delay pulse generator in accordance with some embodiments.

FIG. 2 is a timing diagram of a representative timing of pulses output by a programmable delay pulse generator. The horizontal axis represents time. The programmable delay pulse generator is programmed to generate a pulse stream 230 that has a programmable period. That pulse stream is generated from a fixed frequency reference clock 210. However, as illustrated, the programmable period of pulse stream 230 need not be a multiple of the period of reference clock 210. Rather, the programmable delay pulse generator may be programmed, as to whether and when to emit a pulse, for each period of the reference clock 210. As a result, in this example, the period of clock 210 is T, but the period of the pulse stream can be (T+ΔT).

In order to provide a desired period for pulse stream 230, the programmable delay pulse generator may be programmed to provide different delays 250 ($D_1$), 260 ($D_2$), and 280 ($D_4$) relative to the start of successive cycles defined by edges of clock 210. Moreover, FIG. 2 shows that for some cycles, the clock 210 may have to be suppressed, like at 270.

Any suitable circuitry may generate clock 210, and any suitable circuitry may serve as a programmable delay pulse generator. However, circuitry that can be adapted to perform these functions may exist in an automatic test system that generates and measures digital signals. Such a test system may include a tester clock that defines cycles of tester operation. Circuitry within the test system may take one or more actions, which can be programmed, during each tester cycle. That circuitry may include programmable timing generators that can be programmed to emit one or more pulses at times relative to the start of each tester cycle. Thus, a pulse train with the timing as illustrated in FIG. 2 may be generated by programming the time, relative to the start of successive tester cycles, that a timing generator emits a pulse. Accordingly, a test system may be adapted to provide a pulse train suitable for generation of a reference clock by providing circuitry to compute, for each tester cycle, a delay value to be supplied to a timing generator or, for some tester cycles, to suppress firing of the timing generator.

Further control over a generated frequency of the pulse train may be provided using a form of delta-sigma modulation. A timing generator may provide a finite resolution of delay values that it can receive. Generating a pulse train with a precisely defined period may entail specifying the timing of pulses with finer resolution than the timing generator can accommodate.

Nonetheless, a pulse train may be generated to, on average, have the desired period. The localized deviations from the desired average may introduce high frequency components into the pulse train. These high frequency components may be removed by the filtering effect of a subsequent stage, such as a PLL, providing a reference clock with a precisely programmed frequency and relatively high spectral purity.

Figure 3:
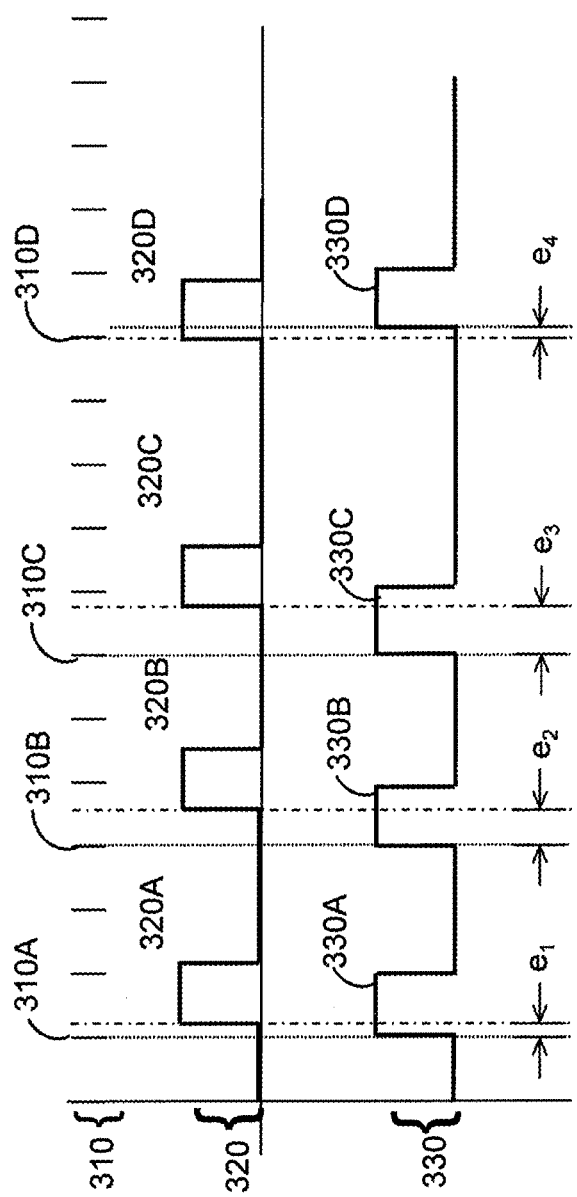
FIG. 3 is a timing diagram illustrating delta-sigma modulation in accordance with some embodiments.

FIG. 3 is a timing diagram illustrating delta-sigma modulation that may be used to program timing of pulses to achieve a desired average period. The horizontal axis represents time. A programmable delay pulse generator may have a defined timing resolution, represented by the series of vertical lines 310 indicating times at which the pulse generator can be programmed to generate a pulse. In this example, pulse train 320 indicates a desired timing of pulses in order to achieve a reference clock with a desired period. As shown, the pulses in pulse train 320 do not align with the times at which the programmable delay pulse generator can be programmed to generate pulses. However, the pulses may be programmed to occur at times such that the average time between pulses corresponds to the desired period.

Delta-sigma modulation is one approach to generating pulses with the desired average spacing with limited time resolution for programming the pulses. Delta-sigma modulation implies that for a repeating event that cannot be precisely matched to a desired value, the deviation from the desired value is set for each repetition to provide an average deviation that approaches zero. In this approach, the first pulse may be programmed to occur at a time most similar to the desired time. In the example of FIG. 3, pulse 330A occurs at a time aligned with time 310A. That time is before the desired edge time of pulse 320A by an amount $e_1$, representing a timing error.

In programming the time of the next pulse, the programmed time may be increased by the desired period between pulses. The possible time 310 at which a pulse can be programmed that is closest to this time may then be determined. In this example, pulse 330B may be programmed to occur at time 310B. This time is before the desired time by an amount $e_2$, representing a further timing error. Values $e_1$ and $e_2$ may be added together to represent an accumulated timing error. In this example, the accumulated error is negative because the programmed times of the pulses is before the desired times.

In this example, the programmed time for a pulse is set to be before the desired time of a pulse, representing the last programmed time plus the desired period between pulses. This approach to setting the time is continued on until the accumulated timing error exceeds some threshold. That threshold may be set to any suitable value, such as one half of a desired time between pulses. For example, the accumulated error after pulses 330A and 330B may be less than one half of the desired period. Accordingly, pulse 330C may be programmed to occur at time 310C, which is before the desired time of pulse 320C. That positioning results in a further error $e_3$.

In this example, the accumulated errors of $e_1$, $e_2$, and $e_3$ may exceed the threshold. Accordingly, the next pulse may be timed to occur at the nearest programmable time after the next computed time. Accordingly, FIG. 3 shows pulse 330D occurring at time 310D. That pulse has a timing error of $e_4$. The accumulated timing error is thus of $e_1+e_2+e_3-e_4$. The resulting accumulated error may indicate whether the next pulse will be programmed before or after the next desired time. In this case, $e_4$ has the opposite sign of errors of $e_1$, $e_2$, and $e_3$. Accordingly, adding $e_4$ to the accumulated error reduces the error. Subsequent pulses may be programmed after the desired time, to continue to reduce the accumulated error.

This pattern may continue until the accumulated error drops to 0 and then starts to grow in magnitude, though the polarity of the error value is reversed. Once the magnitude of the accumulated error has a magnitude exceeding the threshold, the placement of the edges may be changed to change the sign of the error so as to reduce the accumulated error. This process may continue throughout the generation of the pulse train.

Such a pulse train may have an average timing error that approximates zero. Accordingly, the pulse train will have a predominate harmonic that equals a desired frequency. Passing this pulse train through a circuit, such as a PLL with a low pass filter, may provide a reference clock that has a period equal to that of the target clock 320. Where that filtering circuit has a frequency multiplication operation, the resulting reference clock may be at a higher or lower frequency, but that frequency may be precisely controlled by using delta-sigma modulation to achieve an average period of pulse train 330 that matches a desired period.

Control circuitry to generate programmed times for a pulse generator may be simply constructed. The circuitry may track both desired times with more bits than the timing generator accepts to specify a delay, such that an error for each cycle may be computed. The error from cycle-to-cycle may be accumulated. The magnitude and sign of the accumulated error may be used to determine whether the next pulse is to occur at the first time that can be programmed before or after the desired time. When the accumulated error exceeds the threshold, the programmed time for the pulse may be set to provide an error that has a sign opposite of the accumulated error. This process may be continued throughout the period of time during which reference clock signal is being generated. An example of such circuitry is illustrated in FIG. 4.

Figure 4:
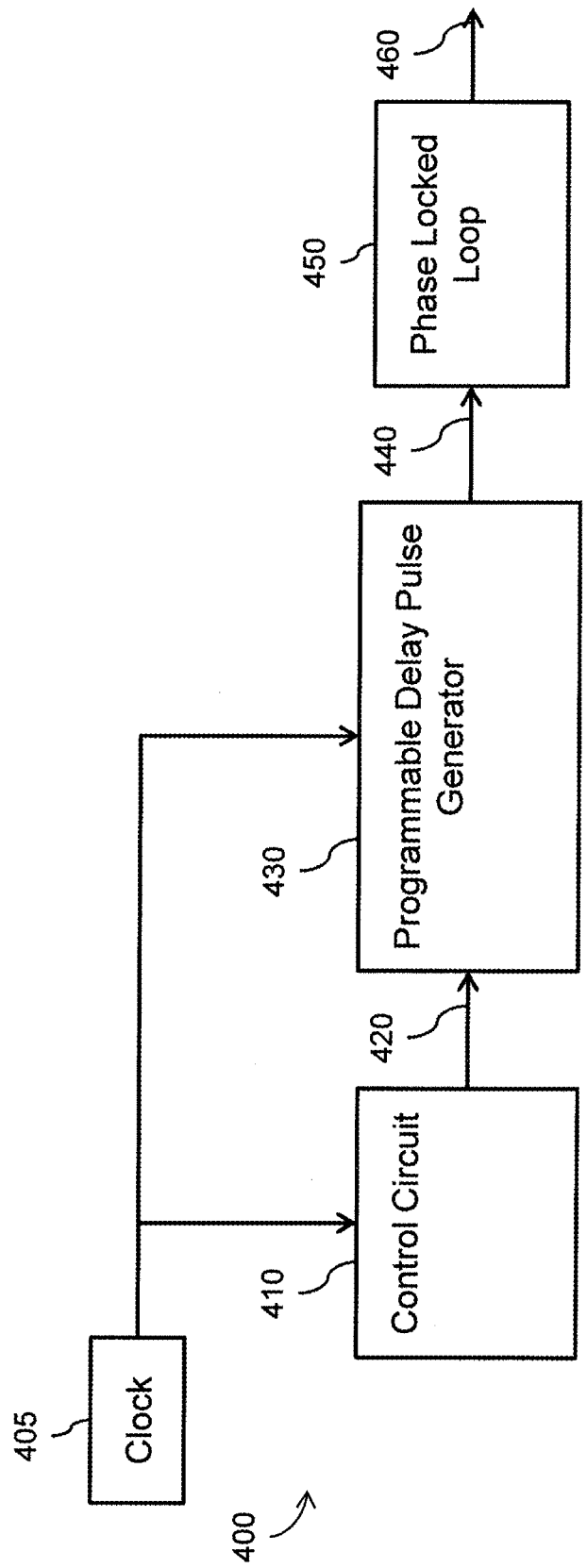
FIG. 4 is a block diagram of a PLL reference clock generator in accordance with some embodiments.

FIG. 4 is a block diagram of a PLL reference clock generator 400. According to some embodiments, a clock 405 may be provided to a control circuit 410 and a programmable delay pulse generator 430. In a test system, clock 405 may be any suitable clock. It may, for example, be the RCLK signal illustrated in FIG. 1, which may be a fixed frequency clock. Alternatively, it may be a clock of programmable frequency, such as may define cycles of tester operation.

The control circuit 410 may be implemented using digital circuit components, including circuits that perform arithmetic operations and memory components that store programmed values or that accumulate values being computed. These components may operate to compute a programmed time for the programmable delay pulse generator 430 for each cycle of clock 405. Alternatively, the computation may indicate that no pulse is to be generated for a specific cycle of clock 405, in which case control circuit 410 may generate an output that suppresses firing of the programmable delay pulse generator.

Any suitable components may be used for this computation. For example, control circuit 410 may include a register that can be loaded with a value indicating a desired average period of a pulse stream. Digital circuitry may then be used to compute, for each pulse in a pulse train, the desired time at which that pulse is to occur and to compare it to times that can be programmed for the pulse generator. Using circuit components such as adders, subtractors, and/or comparators, these values can be processed to compute an error, which may be used to update an accumulator.

The computed programmed time may be output as a delay signal 420 to the programmable delay pulse generator 430. The programmable delay pulse generator 430 may then output pulses in a train 440 that will, on average, have the desired period. That pulse may then be conditioned to turn it into a reference clock. The conditioning may include filtering to remove frequency components other than a desired frequency. That desired frequency may be multiplied or divided in a PLL or other suitable circuit.

Pulse train 440 may be provided to a phase locked loop (PLL) 450, which may perform signal conditioning. Here PLL 450 has an output 460 representing the reference clock. PLL may have a low pass response that provides desired filtering. It may alternatively or additionally be a divide by N PLL, which would multiply frequency. The value of N may be programmed into the PLL 450 using known techniques. Alternatively, PLL 450 may include a capability to receive a value M that could divide down the frequency of the output relative to the average frequency of the input. As yet a further option, PLL 450 may include both a frequency multiplication and division function, such that the output 460 may be a reference clock that has a frequency that is N/M times the average frequency of the pulse train 440.

Figure 5:
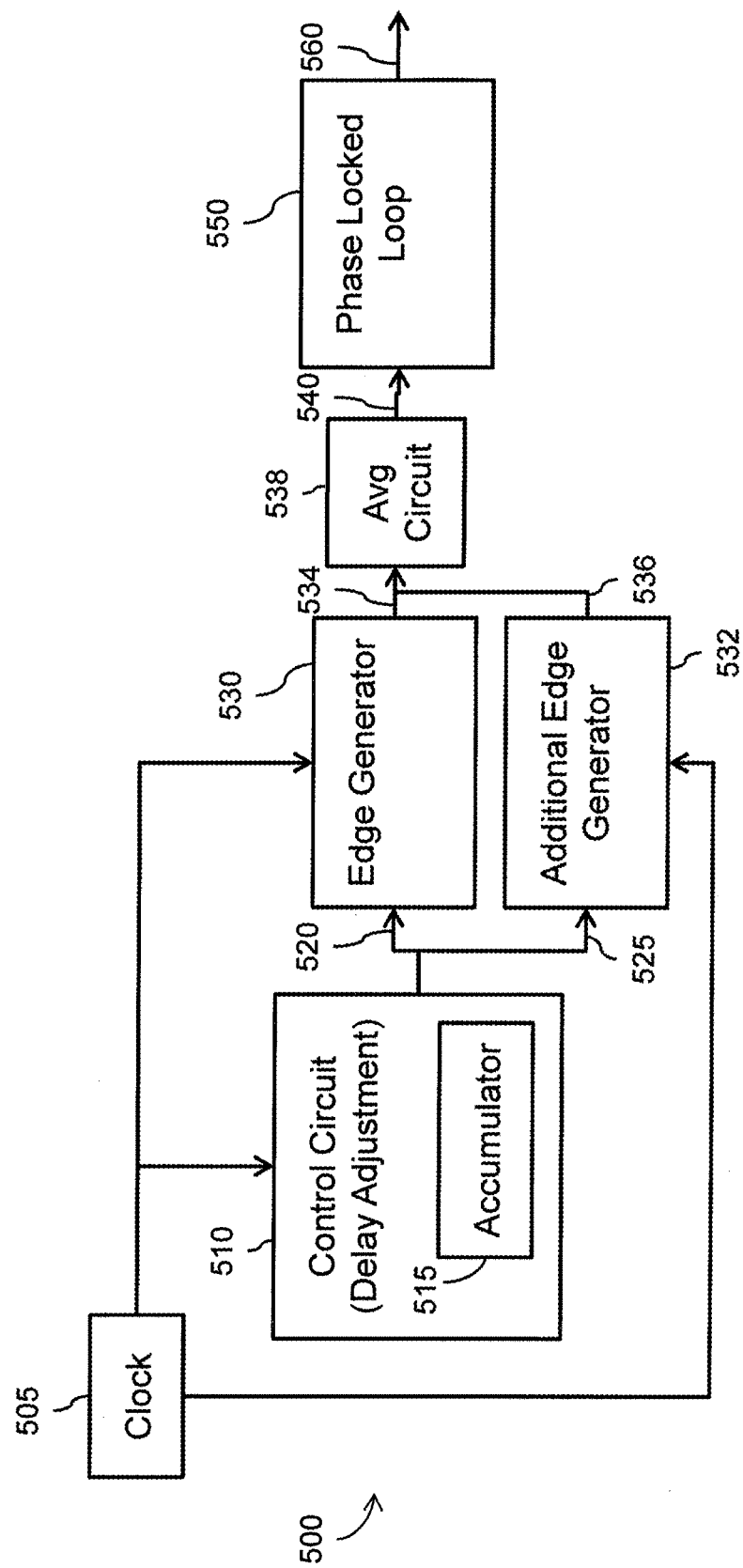
FIG. 5 is a block diagram of a reference clock in accordance with some embodiments.

FIG. 5 is a block diagram of an alternative embodiment of a reference clock generator of FIG. 4. In this example, reference clock generator 500 comprises multiple edge generator circuits and an averaging circuit to implement a programmable delay pulse generator. According to some embodiments, a clock 505 may be provided to a control circuit 510, an edge generator 530, and an additional edge generator (or multiple additional edge generators) 532. Edge generators 530 and 532 may be, for example, edge generators as might be implemented in known formatting/timing circuitry 147 (FIG. 1).

Here multiple edge generators are used (from two to any additional number of edge generators), though their outputs are averaged. In some embodiments, the outputs of multiple edge generators may be programmed to output alternating pulses in a pulse train. Such programming may be used to provide pulses at a faster rate than a single edge generator. However, in the embodiment illustrated, the pulses are provided at a rate that could be delivered by a single pulse generator, the additional edge generator 532 and the averaging circuit 538 may provide better time step resolution due to improved linearity. Each of the edge generators may be programmed to provide pulses at the same time. This configuration and process may reduce jitter caused by inherent circuit noise and the overall deterministic and random noise in the generated pulses. Accordingly, timing inaccuracies of one edge generator may be averaged out when multiple edge generators are used.

According to some embodiments, the pulses of the multiple edge generators 530 and 532 may be calibrated to occur at nearly identical, but slightly different, times and then pass through the averaging circuit 538. The result may still be a single pulse, but the timing of the pulse may be the average of the times of the multiple pulses. This configuration and process may provide effectively higher time step resolution in the averaged edge times through appropriate control of the multiple edge generators. For example, four edge generators and an averaging circuit may provide a time step resolution too high for less edge generators by changing the delay of one of the four edge generators by a minimum time step, thereby shifting the averaged edge time by approximately one fourth of this minimum time step. This configuration and process may provide a more powerful method of delta-sigma modulation known as multi-bit delta-sigma modulation.

In such an embodiment, the programmed times for the pulses in a pulse train maybe computed as described above or in any other suitable way. In embodiments described herein, times are programmed as delay relative to the start of a tester cycle, such that programming a delay in an edge generator that fires for each cycle specifies a time of a pulse. For each pulse, one of the multiple edge generators may be selected and that edge generator may be programmed. In the embodiment illustrated control circuit 510 may compute desired times and distribute the programmed times to the plurality of edge generators.

As described above, a desired period between pulses in a pulse train may be determined. Such determination may be made, for example, by a test programmer or by a test system configuration program executing in a work station, such as work station 110 (FIG. 1). Such a program, for example, may receive as input, such as part of a test program, a desired reference clock frequency. In embodiments in which the output of the programmable delay pulse generator is provided as input to a PLL that multiples the input frequency by M/N, the output frequency will be equal to $1/T_{av}(M/N)$, where $T_{av}$ is the average period of the pulse train. Thus, the frequency may be set by selecting one or more of these parameters. Limitations on the tester hardware will limit the range and resolution of these parameters. Any suitable technique may be used to select appropriate values for these parameters to provide the desired reference clock frequency.

Regardless of the manner in which $T_{av}$ is selected, control circuit 510 may generate programmed times for successive pulses in the pulse train to achieve that desired average period. As described above, the resolution with which pulse times can be programmed may be less than the resolution required to generate the desired resolution for $T_{av}$. As described herein, the desired resolution can be achieved by tracking an accumulated error between the desired time for each pulse and a programmed time that could be achieved. When a pulse cannot be programmed to occur at the desired time, the time for that pulse may be selected to be before or after the desired time in a way that reduces the accumulated error. Accordingly, control circuit 510 may include circuitry to track the accumulated error, which in this embodiment is an accumulator 515.

Accumulator 515 may be controlled to increment or decrement in any suitable way. For example, it may be incremented or decremented for each pulse as the desired time for the pulse is determined. The desired time may be computed relative to any suitable reference time, such as the start of a tester cycle. However, it should be appreciated that any suitable reference time may be used.

The control circuit 510 may use the accumulated error to compute a delay signal 520 and a delay signal 525.

These signals represent timing of odd numbered pulses and even numbered pulses, respectively, in a pulse train. Delay signal 520 may be provided to the edge generator 530 and delay signal 525 may be provided to the additional edge generator 532.

Control circuit 510 may include other components that enable control circuit 510 to compute, for each cycle, a desired time of a pulse that will generate a pulse train with a period that will lead to a reference clock 560 of a programmed frequency. Edge generators 530 and 532 may not be have a resolution necessary to be programmed with the desired time. Accordingly, control circuit 510 may select a time for which the edge generator can be programmed that is either immediately before or immediately after the desired time. As described above, the magnitude and sign of the accumulated error may be used to determine whether the time before or after the desired time is selected.

Based on the programmed times, the edge generator 530 and the additional edge generator 532 may then provide generated pulse trains 534 and 536, respectively, to a averaging circuit 538. Because the edge generators are generating alternating pulses in a pulse train, averaging the outputs of the multiple edge generators provides a pulse train with the desired average period.

The averaging circuit 538 may provide pulse train 540 with desired average period to a phase locked loop 550. As described above, PLL 550 may provide a low pass function, generating a signal with a frequency based on the average period of the pulse train. This frequency may be a multiple of the frequency dictated by the pulse train. That multiple may be an integer multiple, such as when the PLL 550 is a divide by N PLL, or a non-integer multiple, such as when PLL 550 is an N/M PLL. Regardless of whether PLL provides frequency multiplication, the output 560 may serve as a reference clock with the desired programmed frequency.

Figure 6:
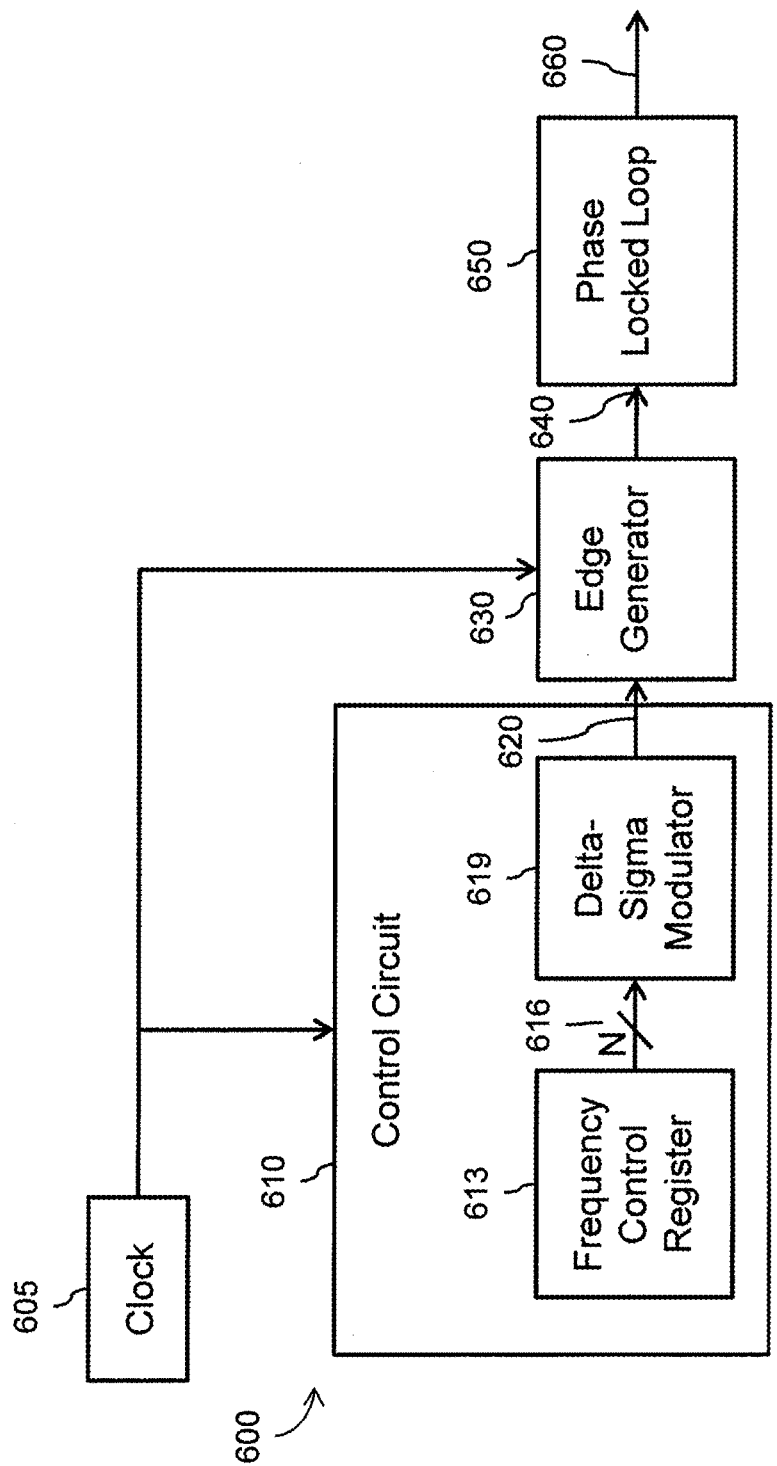
FIG. 6 is a block diagram of a reference clock generator in accordance with some embodiments.

It should be appreciated that the functions described herein may be implemented in any suitable circuitry. FIG. 6 is a block diagram of an alternative embodiment of a reference clock generator that can be programmed with high precision. According to some embodiments, a clock 605 may be provided to a control circuit 610 and an edge generator 630. Clock 605 may represent any suitable clock, including a clock defining tester cycles, which may itself have a programmable frequency.

The control circuit 610 may include a frequency control register 613 and a delta-sigma modulator 619. In some embodiments, a test engineer may specify a value stored in frequency control register 613 either directly, such as through commands entered through a computer workstation 110 (FIG. 1), or indirectly, such as by specifying a value of a clock frequency parameter in a test program. Moreover, the value stored in frequency control register 613 be computed from a specified reference clock frequency, regardless of how the clock frequency is specified, if PLL 650 has frequency multiplication characteristics. Regardless of the manner in which the value in frequency control register 613 is specified, control circuit 610 may generate programmed time values for pulses to be generated by edge generator 630 to provide a pulse train with an average time between pulses to generate the specified frequency.

In this embodiment, frequency control register 613 is shown connected to the delta-sigma modulator 619 via connection 616. Delta-sigma modulator 619 may output a delay signal 620 that has fewer bits of resolution than the output 616 of frequency control register. However, as is known in the art, delta-sigma modulator 619 may generate output values that average out to the value of the higher resolution input setting the percentage of time that the output is above the desired value and below the desired value such that the output averages to the desired value.

The control circuit 610 may provide a delay signal 620 to the edge generator 630. The edge generator 630 may then generate a pulse train with the desired average spacing between pulses, which may be provided to a phase locked loop 650. Phase locked loop 650 may output 660 a reference clock with a desired reference clock frequency by removing higher-order harmonics associated with deviations of individual pulses in the pulse train from the desired average. Additionally, phase locked loop 650 may have a frequency multiplication effect such that the resulting frequency is different than the predominant frequency component of the pulse train.

Figure 7:
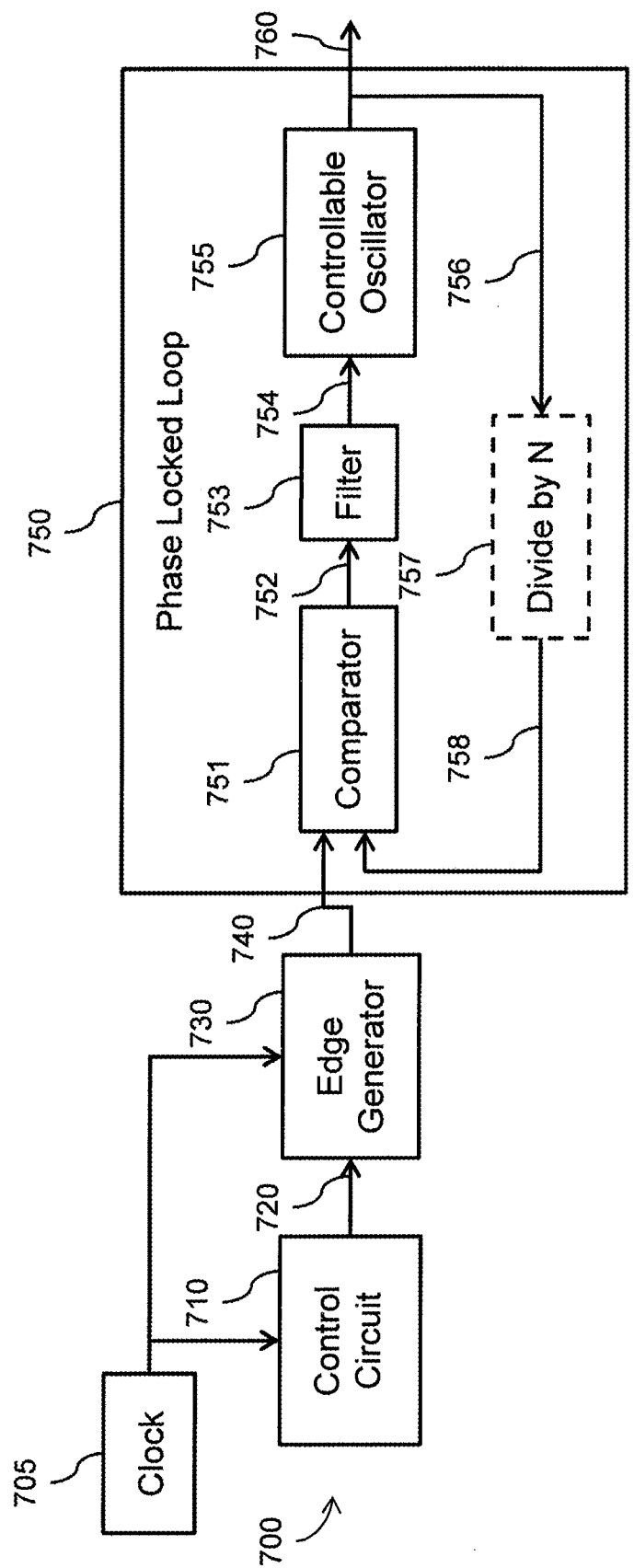
FIG. 7 is a block diagram of a reference clock generator in accordance with some embodiments.

FIG. 7 is a block diagram of the PLL reference clock generator 700 in accordance with some embodiments. According to some embodiments, a clock 705 may be provided to a control circuit 710 and an edge generator 730. As with other embodiments, clock 705 may be a test system clock or may be derived from any other suitable source. Likewise, control circuit 710 may provide a delay signal 720 to the edge generator 730. Delay signal 720 may specify delay values for each cycle of clock 705 or may specify that during a clock cycle no pulse is to be generated.

The edge generator 730 may then provide a pulse train with a desired average period to phase locked loop 750, which may have an output 760 serving as reference clock 760. The phase locked loop 750 may include a comparator 751, a filter 753, a controllable oscillator 755, a divide-by-N operation 757, and connections 752, 754, 756, and 758. In this example, filter 753 may provide a passband that passes a range of frequencies encompass the desired frequency of reference clock 760 while blocking harmonics of those frequencies. Such a filter may be implemented as a low pass passband filter or in any other suitable way.

Phase locked loop 750 may optionally include a divide by N counter 757 in the feedback path including connections 756 and 758. In this configuration, phase locked loop 750 may serve as a frequency multiplier. Alternatively or additionally, a divider may be included in the feedforward path, such as at the output of controllable oscillator 755. Such a counter may be a divide by M counter, which may multiply the frequency output of the phase locked loop 750 by the inverse of M (i.e., 1/M). Though a divide by M counter is not expressly illustrated, such a counter may be used instead of or in addition to divide by N counter 757. Where both counters are used, phase locked loop 750 may multiply the average frequency of the pulse train at output 740 of edge generator 730 by N/M. In this way, by specifying values for N and M, as well as for the average frequency of the pulse train, precise control over the frequency of the reference clock may be provided.

Figure 8:
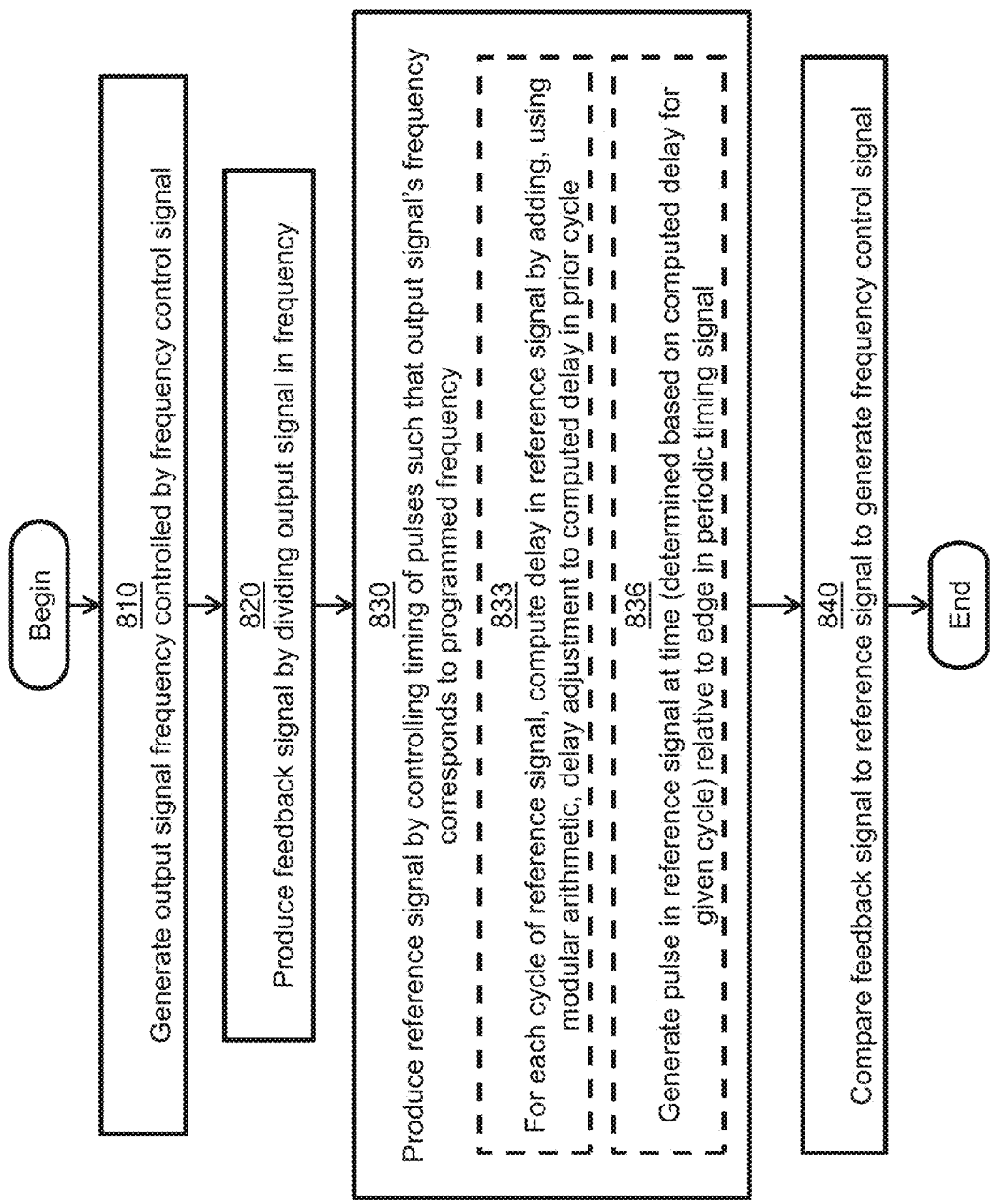
FIG. 8 is a flowchart of a method for generating a PLL reference clock in accordance with some embodiments.

FIG. 8 is a flowchart of a method for generating a PLL reference clock in accordance with some embodiments. According to some embodiments, at step 810, an output signal may be generated with a frequency controlled by a frequency control signal. The frequency control signal, for example, may be provided to an input to a controllable oscillator, such as controllable oscillator 755 (FIG. 7).

At step 820, a feedback signal may be produced by dividing the output signal in frequency. When circuitry as illustrated in FIG. 7 is used, the divided down output signal may correspond to signal 758 (FIG. 7).

In some embodiments, for each cycle of the feedback signal. At step 830, a reference signal may be produced by controlling the timing of pulses such that the pulse train corresponds to a programmed frequency. In some embodiments, for each cycle of the reference signal, a delay in the reference signal may be computed by adding, using modular arithmetic, a delay adjustment to a computed delay in the prior cycle (sub-step 833). The modulus of the modular arithmetic may correspond to the period of a clock defining the cycles, such as clock 705 (FIG. 7).

In some embodiments, a pulse in the reference signal may be generated at a time (which may be determined based on computed delay for given cycle) relative to an edge in a periodic timing signal (sub-step 836). At step 840, the feedback signal may be compared to the reference signal to generate the frequency control signal. This process may be repeated for so long as a reference clock of desired frequency is being generated.

Having thus described several aspects of at least one embodiment of this invention, it is to be appreciated that various alterations, modifications, and improvements will readily occur to those skilled in the art.

For example, embodiments are described in which a pulse train is produced with pulses of programmed times for each clock cycle of a clock with frequency characteristics that do not align with a desired reference clock. The clock may deviate from the desired reference clock because it is lower in frequency, does not have a programmable frequency, or cannot be programmed with a desired frequency resolution. It should be appreciated, however, that a maximum of one pulse generated per clock cycle is described for simplicity of illustration. In some embodiments, an edge generator or other programmable delay pulse generation circuit may be capable of outputting multiple pulses per clock cycle. In those embodiments, the generated pulse train may have an average frequency that is higher than the clock used to control the timing of those pulses.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Also, circuits and modules depicted and described may be reordered in any order, and signals may be provided to enable reordering accordingly.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A periodic signal generation circuit for generating a periodic signal of a programmable frequency, the periodic signal generation circuit comprising:
   a phase locked loop, the phase locked loop comprising:
      a controllable oscillator comprising a controllable oscillator output and a control input, the controllable oscillator being configured to produce the periodic signal at the controllable oscillator output with a frequency controlled by a control signal at the control input; and
      a comparator comprising a first input and a second input and a comparator output, the comparator being configured to produce a signal at the comparator output, wherein the signal is representative of a difference in a phase characteristic between a first signal at the first input and a second signal at the second input, wherein the comparator output is coupled to the control input of the controllable oscillator, and wherein the controllable oscillator output is coupled to the second comparator input;
   a programmable delay pulse generator circuit comprising a delay control input and an output, the output of the programmable delay pulse generator circuit being coupled to the first input of the comparator, the programmable delay pulse generator circuit being configured to output a pulse at the output of the programmable delay pulse generator circuit with a programmable delay following a transition of a reference signal; and
   an adjustment circuit to compute a value of the programmable delay for each of a plurality of cycles of the first signal.

2. The periodic signal generation circuit of claim 1, wherein:
   the programmable delay pulse generator circuit further comprises an edge generation circuit of an automatic test system.

3. The periodic signal generation circuit of claim 1, wherein:
   the phase locked loop is a divide-by-N phase locked loop.

4. The periodic signal generation circuit of claim 3, wherein:
   the divide-by-N phase locked loop is an integer divide-by-N phase locked loop.

5. The periodic signal generation circuit of claim 3, wherein:
   the divide-by-N phase locked loop is a fractional divide-by-N phase locked loop.

6. The periodic signal generation circuit of claim 3, wherein:
   the phase locked loop is a divide-by-N phase locked loop that generates the second signal having a frequency that is 1/N of the frequency of the periodic signal; and
   the adjustment circuit computes the value of a delay for each period of the first signal.

7. The periodic signal generation circuit of claim 1, wherein:
   the periodic signal generation circuit comprises a portion of a channel of an automated test system comprising a plurality of programmable edge generation circuits; and
   the programmable delay pulse generator circuit comprises a programmable edge generation circuit of the plurality of programmable edge generation circuits.

8. The periodic signal generation circuit of claim 7, wherein:
   the reference signal comprises a period clock for the automated test system.

9. The periodic signal generation circuit of claim 1, wherein:
   the adjustment circuit comprises a delta-sigma modulation circuit, the delta-sigma modulation circuit comprising an output coupled to the delay control input of the programmable delay pulse generator circuit.

10. The periodic signal generation circuit of claim 1, wherein:
    the programmable delay pulse generator circuit further comprises:
       at least one additional programmable delay pulse generator circuit; and
       an averaging circuit coupled to:
          the output of the programmable delay pulse generator circuit, an output of the at least one additional programmable delay pulse generator circuit, and the first input of the comparator.

11. A method of generating a periodic signal of a programmed frequency, the method comprising:
    generating an output signal comprising a controlled frequency that is controlled in response to a frequency control signal;
    producing a feedback signal by dividing in frequency the output signal;
    producing a reference signal; and
    comparing the feedback signal to the reference signal to generate the frequency control signal,
    wherein producing the reference signal comprises controlling a timing of each of a plurality of pulses in the reference signal such that the controlled frequency of the output signal corresponds to the programmed frequency,
    wherein producing the reference signal further comprises, for each of a plurality of cycles of the reference signal, computing a delay in the reference signal by adding a delay adjustment to a computed delay in a prior cycle.

12. The method of claim 11, wherein:
the adding is performed using modular arithmetic.

13. The method of claim 11, wherein:
producing the reference signal further comprises generating a pulse in the reference signal at a time relative to an edge in a periodic timing signal, wherein the time is determined based on the computed delay for a respective cycle.

14. The method of claim 11, wherein:
producing the feedback signal comprises, for each of a plurality of cycles of the feedback signal, computing a delay in the feedback signal by adding a delay adjustment to a computed delay in a prior cycle.

15. An automatic test system configured for generating a periodic signal of a programmable frequency, the automatic test system comprising:
    a clock having a period;
    an edge generator coupled to the clock, the edge generator comprising an edge generator output, an enable input and a delay input, wherein the edge generator produces at the edge generator output a signal with a delay relative to an edge of the clock specified by a value at the delay input in each cycle of the clock for which the enable input is asserted;

a phase locked loop comprising a reference input and a phase locked loop output configured to provide the periodic signal of the programmable frequency, wherein the reference input is coupled to the edge generator output; and a delay adjustment circuit comprising:
  a delay adjustment circuit output coupled to the delay input of the edge generator, and
  an accumulator that increases in value by a programmed amount for each cycle of the clock,
  wherein, when the accumulated value exceeds the period of the clock, the delay adjustment circuit suppresses an enable signal coupled to the enable input of the edge generator and rolls over the accumulated value.

16. The automatic test system of claim 15, wherein:
the phase locked loop is a divide-by-N phase locked loop.

17. The automatic test system of claim 16, wherein:
the divide-by-N phase locked loop is an integer divide-by-N phase locked loop.

18. The automatic test system of claim 16, wherein:
the divide-by-N phase locked loop is a fractional divide-by-N phase locked loop.

19. The automatic test system of claim 16, wherein:
the divide-by-N phase locked loop generates a feedback signal having a frequency that is 1/N of the frequency of the phase locked loop output; and
the delay adjustment circuit computes the value of the delay for each period of a reference signal.

20. The automatic test system of claim 15, further comprising:
at least one additional edge generator coupled to the clock; and
an averaging circuit coupled to:
  the edge generator output, an output of the at least one additional edge generator, and the reference input of the phase locked loop.

* * * * *